July 3, 1973 C. H. FA 3,743,552

PROCESS FOR COPLANAR SEMICONDUCTOR STRUCTURE

Filed Oct. Original 18, 1967 2 Sheets-Sheet 1

INVENTOR.
CHARLES H. FA

BY Howard A. Silber

ATTORNEY

PROCESS FOR COPLANAR SEMICONDUCTOR STRUCTURE

Filed Oct. Original 18, 1967

2 Sheets-Sheet 2

INVENTOR.
CHARLES H. FA

BY Howard A. Silber

ATTORNEY

United States Patent Office 3,743,552
Patented July 3, 1973

3,743,552

PROCESS FOR COPLANAR SEMICONDUCTOR STRUCTURE

Charles H. Fa, Newport Beach, Calif., assignor to North American Rockwell Corporation Original application Oct. 18, 1967, Ser. No. 676,331, now abandoned. Divided and this application Jan. 30, 1970, Ser. No. 12,484
Int. Cl. H01l *7/34, 7/50, 19/00*
U.S. Cl. 148—175 3 Claims

ABSTRACT OF THE DISCLOSURE

A composite comprising a monocrystalline, electrically insulating substrate disposed atop which are semiconductor segments separated by isolation sidewalls. The semiconductor segments and the isolation sidewalls are substantially contiguous and coplanar. The composite may be produced by providing a film of phosphosilicate glass on a sapphire substrate. The glass is etched away in locations where sidewalls are desired. The substrate is heated to an elevated temperature at which the phosphorous in the glass reacts to corrode away the substrate. After removal of the residual glass, device grade semiconductor is deposited atop the substrate between the isolation sidewalls.

COPENDING APPLICATION

This is a division of application Ser. No. 676,331, filed Oct. 18, 1967, now abandoned.

BACKGROUND OF THE INVENTION

(1) Field of the invention

The present invention relates to a composite comprising a plurality of semiconductor islands separated by contiguous coplanar isolation sidewalls atop a monocrystalline, electrically insulating substrate. More particularly, the invention relates to a process of producing such a composite on a substrate such as sapphire by controlled corrosion of the substrate using a phosphorous-doped pyrolytic silicon oxide.

(2) Description of the prior art

As microelectronic integrated circuits become more and more densely packaged, the requirement for isolation between adjacent semiconductor devices becomes more severe. While various techniques have been used to the past to achieve such isolation, these prior art approaches suffer various shortcomings. For example, when active devices are fabricated adjacent one another in a monolithic silicon substrate, the technique of back biasing does not achieve sufficient electrical isolation between adjacent components to permit very high density packaging.

The use of isolated single crystal semiconductor segments disposed within a substrate of polycrystalline material and isolated by a thin film of oxide is a satisfactory approach to the problem; however such polyisolation involves somewhat complex fabrication steps. A more satisfactory approach is the use of silicon epitaxially deposited on sapphire and etched away to form isolated semiconductor mesas on the sapphide substrate. However, because the mesas extend above the surface of the sapphide, bevelling of the edges of the mesas is required to allow fabrication of metal interconnections between adjacent devices. This bevelling inherently increases the required separation between adjacent devices and hence sets a maximum value for the density of component on a given substrate.

The present invention provides a composite on a monocrystalline, electrically insulating substrate in which isolated single crystal semiconductor segments are separated by isolation sidewalls. This structure permits subsequent fabrication of microelectronic circuits in which adjacent semiconductor devices may be spaced more closely than in prior art structures. Optimum device density thereby is achieved, while retaining the good electrical isolation characteristics provided by a silicon-on-sapphire structure. In addition, the composite readily facilitates subsequent deposition of metallic interconnections between devices.

SUMMARY OF THE INVENTION

In accordance with the present invention, there is set forth a composite comprising a single crystal, electrically insulating substrate such as sapphire, BeO, MgO, or the like. Atop the substrate are provided isolated semiconductor islands of silicon, germanium, gallium arsenide or the like. The semiconductor regions are separated by isolation sidewalls of sapphire or other electrically insulating material. The semiconductor segments and the isolation sidewalls are substantially contiguous and coplanar therby providing a smooth upper surface on which interconnections easily may be deposited.

The inventive composite may be fabricated on a sapphire substrate by initial deposition of a phosphorous doped pyrolytic oxide or a phosphosilicate glass. The oxide or glass preferentially is etched away in regions where isolation sidewalls are desired, the remaining oxide or glass corresponding to the desired locations of semiconductor segments. The substrate is heated to a temperature sufficient to permit reaction between the phosphorous and the underlying sapphire, thereby corroding away the substrate. After removal of the residual oxide or glass and the sapphire reaction product, semiconductor islands may be epitaxially deposited onto the substrate in the corroded regions.

Thus it is an object of the present invention to provide a composite for the fabrication of electrically isolated semiconductor devices on an electrically insulating substrate.

It is another object of the present invention to provide a composite comprising a substrate on which is disposed a coplanar array of semiconductor segments separated by isolation sidewalls.

It is yet another object of the present invention to provide a composite comprising a single crystals, electrically insulating substrate disposed atop which are a plurality of semiconductor segments separated by contiguous, coplanar isolation sidewalls.

A further object of the present invention is to provide techniques for producing on a single crystal, electrically insulating substrate a composite having isolated semiconductor regions coplanar with and isolated by contiguous sidewalls.

These and other objects and features of the present invention will become clear in conjunction with the following description and drawings.

DESCRIPTION OF THE PREFERRED EMBODIMENTS

Figure 1:
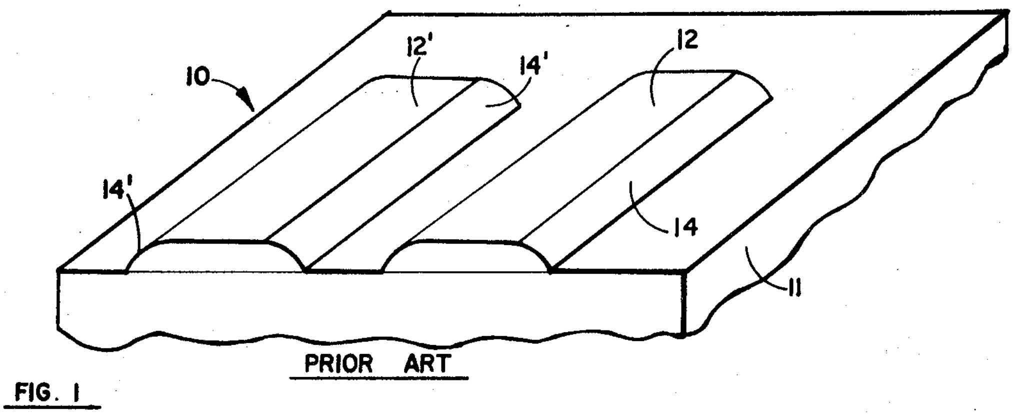
PRIOR ART FIG. 1
FIG. 1 is a greatly enlarged perspective view of a prior art composite comprising single crystal, mesa-type semiconductor islands atop an insulating substrate.

The inventive coplanar semiconductor structure is designed to overcome the shortcomings of the prior art, and, in particular, to permit denser device packaging than is possible with mesa-type isolated semiconductor structure such as that illustrated in FIG. 1. Referring to FIG. 1, note that prior art structure 10 comprises substrate 11 of single crystal, electrically insulating material, typically sapphire, MgO, BeO, magnesium aluminate spinel or the like. Disposed stop substrate 11 are islands 12 and 12' of epitaxially grown semiconductor material, typically silicon or germanium. Note that edges 14 and 14' are bevelled to permit metallized interconnections to be deposited between islands 12 and 12'. Of course, semiconductor devices such as transistors or diodes are produced on islands 12 and 12' by diffusion and other processing steps well known to those in the integrated circuit art.

Still referring to FIG. 1, it is apparent that the prior art bevelled edge mesa type semiconductor island configuration is wasteful of space. The bevelling required to facilitate interconnections makes it very difficult to produce integrated circuits with a distance between adjacent semiconductor islands of less than about 1.5 to 2 mils, and with a dimensional variation better than 0.3 to 0.5 mils. For most integrated circuits, much closer spacing and tighter tolerances are desired to achieve optimum device density.

Figure 2:
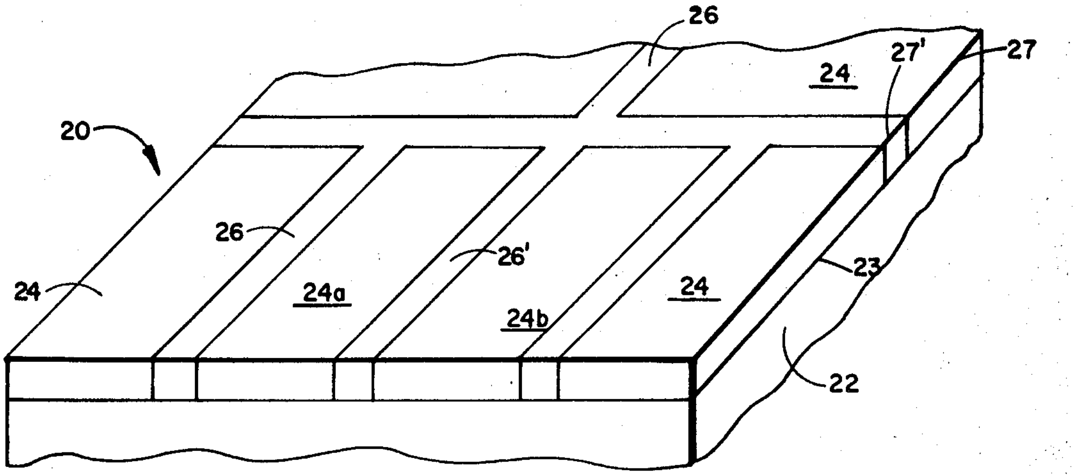
FIG. 2 is a greatly enlarged perspective view of a composite in accordance with the present invention. The composite includes isolated semiconductor segments disposed atop a single crystal electrically insulated substrate and separated by contiguous isolation sidewalls.

In contra-distinction to the prior art, FIG. 2 illustrates one embodiment of a coplanar semiconductor structure in accordance with the present invention. Referring to FIG. 2, inventive composite 20 includes monocrystalline, electrically insulating substrate 22 which may comprise sapphire, Mg., BeO, spinel, or other electrically insulating material on which a semiconductor may be epitaxially disposed. Atop surface 23 substrate 22 are disposed semiconductor islands 24, 24*a*, and 24*b*, each of single crystal semiconductor material such as silicon, germanium, gallium, arsenide or the like.

Islands 24 (see FIG. 2) are separated from one another by isolation sidewalls 26 extending above surface 23. Isolation sidewalls 26 are of electrically insulating material which may be the same as or different from the material of substrate 22. Of course, sidewalls 26 preferably comprise a material which will not deteriorate in subsequent diffusion and other processing steps used to fabricate devices on islands 24. Note that sidewalls 26 generally are rectangular in cross section and abut directly against the sides of adjacent islands. For example, isolation sidewall 26' separates and is contiguous with adjacent islands 24*a* and 24*b*. In a preferred embodiment, upper surface 27 of islands 24 is coplanar with upper surface 27' of isolation sidewall 26.

Note in FIG. 2 that composite 20 is characterized by very close spacing between adjacent islands (e.g. between islands 24*a* and 24*b*). Typically, the width of isolation sidewalls 26 or 26' is 1 mil. The thickness of semiconductor islands 24 and of isolation sidewalls 26 may be quite small, typically on the order of 0.5 to 2 microns.

Comparison of prior art semiconductor structure 10 illustrated in FIG. 1 with inventive coplanar semiconductor composite 20 of FIG. 2 indicates that the inventive structure permits higher density packaging of individual, electrically isolated, semiconductor devices than does the prior art configuration. Clearly, there is no requirement for bevelling of the edges of island 24, since metallized conductors interconnecting the semiconductor regions may be deposited directly onto coplanar upper surface 27.

Various techniques may be used to produce the inventive coplanar semiconductor structure. For example, composite 20 illustrated in FIG. 2 may be fabricated by the steps illustrated in FIGS. 3*a*, 3*b*, and 3*c*.

Figure 3A:
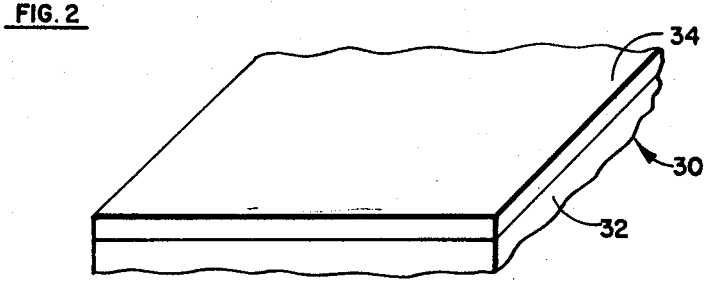
FIGS. 3*a*, 3*b* and 3*c* each are greatly enlarged perspective views illustrating the process steps which may be utilized to form the inventive composite of FIG. 2. In this embodiment, the isolation sidewalls may comprise a pyrolytic oxide.

Referring to FIG. 3*a*, composite 30 comprises substrate 32 of electrically insulating, single crystal material. By way of example, substrate 32 will be described herein as sapphire, however, it should be understood that other monocrystalline, electrically insulating materials such as MgO, BeO, spinel or the like maybe used for substrate 32.

As a first step in the fabrication inventive coplanar structure 20, substrate 32 (see FIG. 3*a*) is coated pyrolytically with an undoped layer 34 of silicon oxide or the like approximately 2 microns thick. Preferably, oxide layer 34 is produced over sapphire substrate 32 at a relatively low temperature (on the order of 750° C.). Subsequently, oxide layer 34 is annealed at a high temperature (typically on the order of 1200° C. or above) to densify the oxide and give it a somewhat vitreous quality.

Figure 3B:
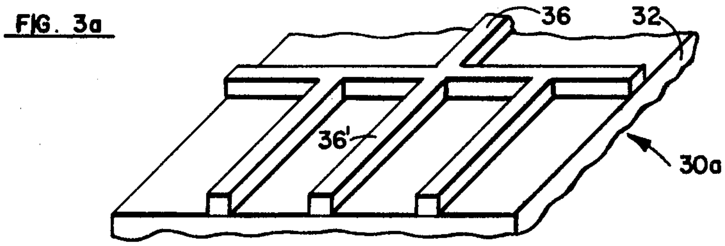

As a next step, illustrated by FIG. 3*b*, isolation sidewalls 36 and 36' are formed from layer 34 using conventional photolithographic techniques. For example, film 34 may be covered with a photoresist such as Kodak KTFR. The photoresist is exposed through an appropriate mask and the unexposed areas (corresponding to locations where sidewalls 36 are not desired) of KTFR and underlying oxide 34 preferentially etched. After removal of the residual photoresist, the resultant product has the appearance of composite 30*a*.

Figure 3C:
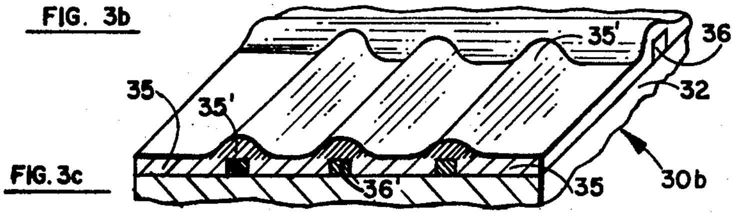

Next a semiconductor such as silicon is deposited atop composite 30*a* to form layer 35 (see FIG. 3*c*). Preferably this is accomplished by placing structure 30*a* in an appropriate epitaxial reactor and depositing silicon using gas phase epitaxial techniques such as that described in the copending application to H. M. Manasevit et al., Ser. No. 524,765, filed Feb. 3, 1966, now Pat. No. 3,508,962, issued Apr. 28, 1970 owned by North American Rockwell Corporation, owner of the present application. As shown, deposited semiconductor layer 35 will be in single crystal, epitaxial form over those regions of substrate 32 where isolation sidewalls 36 or 36' are absent. Silicon, possibly in non-single crystal form, also will be deposited atop sidewalls 36, as designated 35' in FIG. 3*c*, forming structure 30*b*.

Finally, non-single crystal regions 35' of semiconductor are removed from structure 30*b* by conventional mechanical or chemical polishing techniques. The resultant structure will have the appearance of that illustrated in FIG. 2. In the illustrative example, substrate 22 will comprise sapphire, islands 24, 24*a* and 24*b* comprise single crystal silicon and isolation sidewalls 26 and 26' comprise silicon oxide. Of course, conventional techniques then may be used to fabricate active or passive circuit elements on islands 24 and to interconnect these by metal conductors deposited on coplanar surface 27.

Figures 4A, 4B, 4C, 4D:
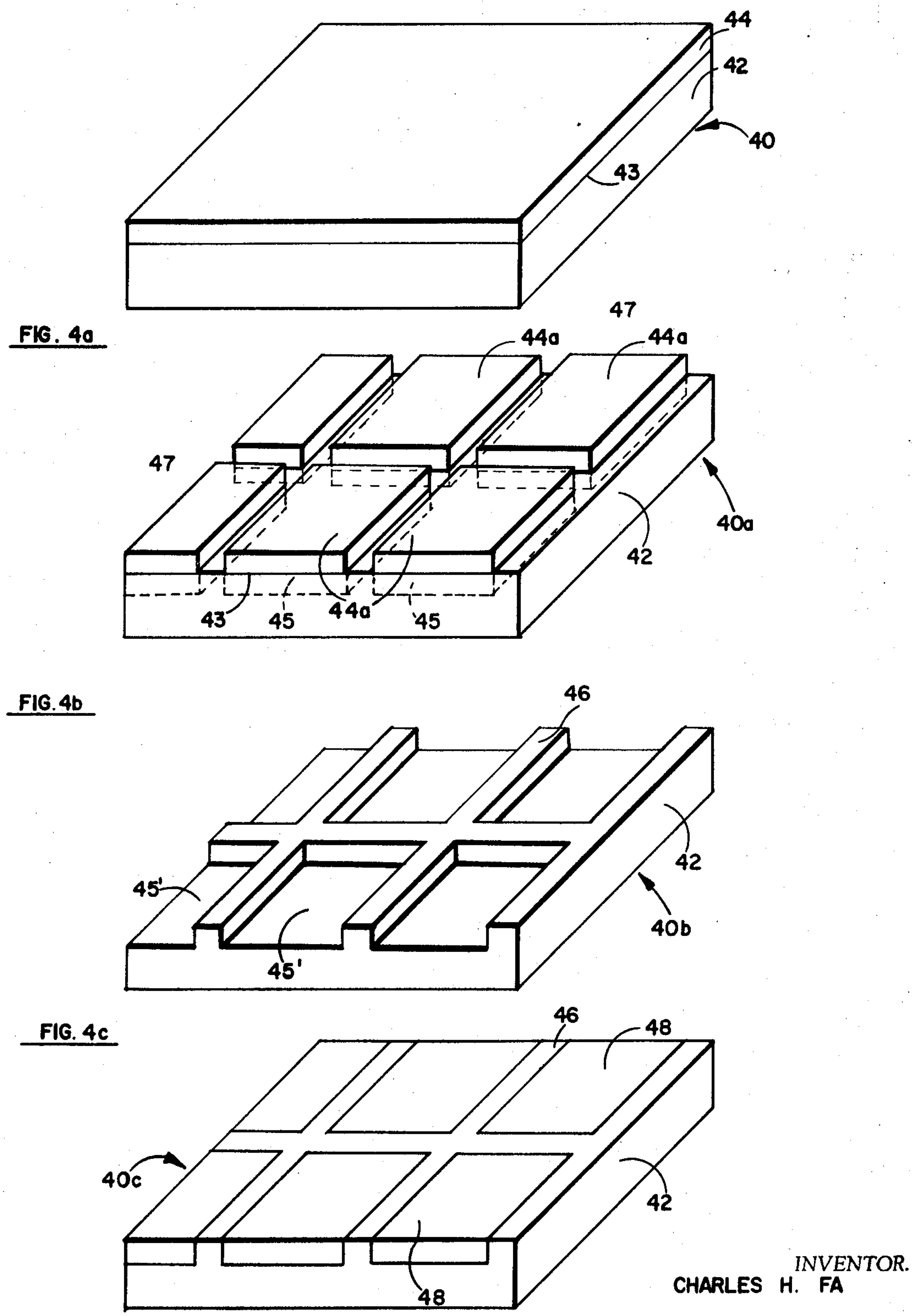
FIGS. 4*a*, 4*b*, 4*c* and 4*d* each are greatly enlarged perspective views illustrating the steps for fabricating an alternative embodiment of the inventive composite. In this embodiment, the isolation sidewalls separating adjacent semiconductor segments are unitary with the electrically insulating, monocrystalline substrate.

A technique for fabricating another embodiment of a coplanar semiconductor structure in accordance with the present invention is illustrated in FIGS. 4*a* through 4*d*. Referring to FIG. 4*a*, composite 40 comprises substrate 42 of single crystal, electrically insulating material. By way of example, substrate 42 is described herein as sapphire, but it shall be understood that the invention is not so limited and that other single crystal electrically, insulating substrates also be used for substrate 42.

As a first step, upper surface 43 of substrate 42 is covered with layer 44 of phosphorous doped oxide. Layer 44 may be produced by depositing phosphorous from an organic phosphorous source in the gas phase together with an organo-oxysilane. Typically, the organic oxysilane may comprise tetraethyl orthosilicate $Si(OC_2H_5)_4$ while the organic phosphorous source may comprise trimethyl phosphate $(CH_3)_3PO_4$, trimethyl phosphite $(CH_3O)_3P$, or triethyl phosphate $(C_2H_5O)_3PO$.

In a preferred embodiment, deposition of layer 44 (see FIG. 4*a*) may be accomplished by placing substrate 42 in a furnace tube and heating it to a temperature on the order of 600° C. Next, nitrogen or oxygen gas is bubbled through a liquid mixture of tetraethyl orthosilicate and the organic phosphorous source and then directed over heated substrate 42. Phosphorous doped silicon oxide (possibly with some organic impurities) deposits out on surface 43, generally in a polycrystalline or amorphous form.

Alternatively, the carrier nitrogen or oxygen gas may be bubbled independently through tetraethyl orthosilicate and through the phosphate source and the gases mixed in the furnace tube deposition chamber to accomplish deposition of layer 44.

An alternative method of producing layer 44 is to start with a composite comprising substance 42 of sapphire containing a film of silicon on upper surface 43. Typically, the silicon film may be on the order of one micron thick. This silicon on sapphire combination then is heated in a oxidizing atmosphere at a sufficiently high temperature to convert the silicon to silicon dioxide. During the heating process, a phosphorous containing gas is mixed with the oxidizing atmosphere to produce phosphorous doping of the silicon dioxide.

In either instance, layer 44 (see FIG. 4*a*) substantially comprises phosphorous doped $SiO_2$ or phosphosilicate glass.

Having formed phosphorous doped layer 44, the next step (illustrated in FIG. 4*b*) is to etch away channels 47 through the entire thickness of layer 44 positionally corresponding to the desired locations of isolation sidewalls 46. This etching may be accomplished by photolithographic techniques well known to those skilled in the art. Note in FIG. 4*b* that remaining segments **44*a* of pyrosilicate glass correspond in location to those regions on which semiconductor segments are desired in the final composite. Structure 40*a*** (see FIG. 4*b*) then is placed in a furnace and heated in an oxygen atmosphere to a temperature sufficiently high that the phosphorous contained in regions **44*a* reacts with the sapphire of substrate 42 to "corrode" away areas 45** (illustrated by dotted lines in FIG. 4*b*). Typically, heating to a temperature on the order of 1200° C. for 12 to 15 hours accomplishes satisfactory corrosion of sapphire substrate 42. Next, hydrofluoric acid may be used to etch away remaining phosphosilicate glass **44*a* and to remove the reaction product of the phosphorous and the sapphire. The resultant structure 40*b*** has the appearance illustrated in FIG. 4*c*. In particular, structure **40*b* comprises unitary sapphire substrate 42 containing isolation sidewalls 46 defining regions 45'** in which semiconductor islands subsequently may be provided.

Next, silicon may be grown by well known epitaxial techniques onto substrate 42 to form semiconductor islands 48 separated by isolation sidewalls 46. An appropriate maskant may be used on the upper surface of sidewalls 46 to prevent silicon growth atop the sidewalls during deposition. The final structure has the appearance illustrated in FIG. 4*d* as composite **40*c*. In a preferred embodiment, semiconductor islands 48** have a thickness on the order of 0.5 to 2 microns.

Although it may seem that the parasitic capacitance of the inventive coplanar semiconductor device illustrated in FIG. 2 or 4*d* would be higher than that of the prior art mesa-type structure illustrated in FIG. 1 (for islands of identical size), the difference in capacitance between the two devices is negligible for all practical purposes. This results since the thickness of semiconductor segments 24 (see FIG. 2) or 48 (see FIG. 4*d*) is very thin (typically 0.5 to 2 microns) making the sidewall area surrounding a typical island much smaller than the bottom area of the island.

As an example, comparing the total parasitic capacitance of two devices with identical dimensions but different constructions, the following may be seen. Assume that each island has an area 10 mils x 10 mils ($=6.25\times10^{-4}$ cm.$^2$) and a thickness of 1.5 microns ($=1.5\times10^{-4}$ cm.). Let the spacing between adjacent islands equal 1 mil. ($=2.5\times10^{-2}$ cm.) and let the sapphire substrate be 10 mils ($=2.5\times10^{-2}$ cm.) thick. The total sidewall area then is $1.5\times10^{-5}$ cm.$^2$, and the bottom area is $6.25\times10^{-4}$ cm.$^2$. The following values of capacitance C are obtained.

| | Prior art mesa structure, air isolation, pfc | Inventive coplanar structure, $SiO_2$ isolation, pfc |
|---|---|---|
| C sidewall | $0.53\times10^{-3}$ | $2.12\times10^{-3}$ |
| C bottom | $22.2\times10^{-3}$ | $22.2\times10^{-3}$ |
| C total | $2.27\times10^{-2}$ | $2.43\times10^{-2}$ |

For most applications, the difference between the values of total capacitance is insignificant.

Note that the invention coplanar semiconductor structure illustrated in FIG. 2 or FIG. 4*d* of course may be used as a starting material for the fabrication of an integrated circuit. In such case each island 24 or 48 subsequently is processed by a diffusion or other steps well known to those skilled in the art to produce therein various transistors, diodes or other semiconductor devices. Isolation sidewalls 46 and insulating substrate 42 provide electrical isolation between adjacent devices so produced. The planar upper surface of the inventive composite permits metallic conductors easily to be deposited to interconnect these devices.

Although the invention has been described in detail, it is to be understood that the same is by way of illustration and example only, and is not to be taken by way of limitation, the spirit and scope of this invention being limited only by the terms of the appended claims.

I claim:

1. In a process for producing a composite comprising a plurality of semiconductor segments disposed on a monocrystalline electrically insulating sapphire substrate, wherein said segments are separated by sidewalls comprised of the same material as the substrate, comprising the steps of:

heating said sapphire substrate;

depositing a phosphorus-doped oxide layer upon a major surface of the substrate;

etching a plurality of channels through said oxide layer so as to expose the material of the substrate in the confines of said channels thereby providing a plurality of isolated segments of said oxide layer material on said substrate;

heating the substrate with said plurality of isolated oxide segments thereon to a temperature sufficiently high to cause the phosphorus of said oxide segments to react with the sapphire substrate to corrode away portions of the substrate material thereby forming depressions in the substrate material, said depressions defined by sidewalls rising above said depressions at locations where said channels had previously been etched in said oxide layer;

supplying hydrofluoric acid to the structure to the extent necessary to remove any remaining portion of said oxide layer and to remove any reaction products generated by the reaction of said oxide layer with said substrate, overlaying a masking material on the outer surfaces of the sidewalls which outer surfaces are orthogonal to the portions of the sidewalls that rise from the surface of the substrate and which represent the surface of said substrate from which said oxide layer was etched in said channels, epitaxially growing said semiconductor segments on said substrate material and in said depressions; and removing the masking material.

2. The invention as stated in claim 1, wherein the step of depositing said oxide layer comprises:

passing a gas through a mixture consisting of tetraethyl orthosilicate and an organic phosphorus source material, and directing said gas at said substrate.

3. The invention as stated in claim 2, wherein:

the organic phosphorus source material is selected from the group consisting of trimethyl phosphate, trimethyl phosphite or triethyl phosphate.

References Cited

UNITED STATES PATENTS

| | | | |
|---|---|---|---|
| 3,496,037 | 2/1970 | Jackson et al. | 148—175 |
| 3,433,686 | 3/1969 | Marinace | 148—175 |
| 3,133,336 | 5/1964 | Marinace | 148—175 X |
| 3,320,485 | 5/1967 | Buie | 317—101 |
| 3,393,349 | 7/1968 | Huffman | 317—101 |
| 3,442,011 | 5/1969 | Strieter | 29—578 |
| 3,471,754 | 10/1969 | Hoshi et al. | 317—235 |

OTHER REFERENCES

Hart et al.: "Electrical Properties of Epitaxial Silicon Films on α-Alumina," British J. Applied Physics, October 1967, vol. 18, pp. 1389–1398.

Maxwell et al.: "Minimization of Parasitics in Integrated Circuits . . . Isolation," IEEE Trans. on Electron Devices, vol. ED–12, No. 1, January 1965, pp. 20–25.

Dumin, D. J.: "Electrical Properties of Silicon Films Grown Epitaxially on Sapphire," J. Applied Physics, vol. 38, No. 4, Mar. 15, 1967, pp. 1909–1914.

Faktor et al.: "Preliminary Study of Chemical Polishing of α-Corundum . . . ," J. Electrochemical Society, vol. 114, No. 4, April 1967, pp. 356–359.

L. DEWAYNE RUTLEDGE, Primary Examiner

W. G. SABA, Assistant Examiner

U.S. Cl. X.R.

29—577, 578, 580; 117—106, 201, 212; 148—1.5, 174; 156—17; 317—235 R

PO-1050
(5/69)

UNITED STATES PATENT OFFICE
CERTIFICATE OF CORRECTION

Patent No. 3,743,552 Dated July 3, 1973

Inventor(s) Charles H. Fa

It is certified that error appears in the above-identified patent and that said Letters Patent are hereby corrected as shown below:

Column 3, line 19, change "stop" to --atop--.

Column 3, line 42, change "Mg." to --MgO--.

Column 5, line 15, change "substance" to --substrate--.

Column 6, line 14, change "pfc" (both occurrences) to --pf--.

Signed and sealed this 20th day of November 1973.

(SEAL)
Attest:

EDWARD M.FLETCHER,JR.
Attesting Officer

RENE D. TEGTMEYER
Acting Commissioner of Patents